US 6,636,756 B2

(12) United States Patent
Zhu

(10) Patent No.: US 6,636,756 B2
(45) Date of Patent: Oct. 21, 2003

(54) K-SPACE SYNTHESIS FOR MR IMAGING IN THE PRESENCE OF GRADIENT FIELD NONLINEARITY

(75) Inventor: Yudong Zhu, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 269 days.

(21) Appl. No.: 09/728,222

(22) Filed: Nov. 30, 2000

(65) Prior Publication Data

US 2002/0093334 A1 Jul. 18, 2002

Related U.S. Application Data

(60) Provisional application No. 60/168,121, filed on Nov. 30, 1999.

(51) Int. Cl.[7] .............................................. A61B 5/05
(52) U.S. Cl. ...................................................... 600/410
(58) Field of Search ................................. 600/410, 411, 600/412, 413, 414, 415, 416, 417, 418, 419, 420, 28.1, 422, 423; 324/306, 307, 308, 309, 310, 311, 312, 313, 314, 315

(56) References Cited

U.S. PATENT DOCUMENTS

| | | | | |
|---|---|---|---|---|
| 4,591,789 A | | 5/1986 | Glover et al. ................ 324/307 |
| 5,402,067 A | * | 3/1995 | Pauly et al. ................. 324/307 |
| 5,757,187 A | * | 5/1998 | Wollin ........................ 324/306 |
| 5,760,582 A | * | 6/1998 | Morrone ..................... 324/318 |
| 6,144,873 A | * | 11/2000 | Madore et al. ............. 324/309 |
| 6,239,598 B1 | * | 5/2001 | Zhang ......................... 324/307 |
| 6,246,895 B1 | * | 6/2001 | Plewes ....................... 324/309 |
| 6,252,401 B1 | * | 6/2001 | Werthner et al. ........... 324/307 |
| 6,353,752 B1 | * | 3/2002 | Madore et al. ............. 324/307 |

* cited by examiner

Primary Examiner—Teresa Walberg
Assistant Examiner—Daniel Robinson
(74) Attorney, Agent, or Firm—Jean K. Testa; Patrick K. Patnode

(57) ABSTRACT

In an embodiment, a method for reconstructing a corrected Magnetic Resonance (MR) image from acquired MR data subjected to gradient field non-linearity comprises producing a data set that corresponds to linear gradient fields responsive to the acquired MR data and reconstructing the data set into the corrected MR image. Thus, correction for distortion is a k-space based correction method.

6 Claims, 5 Drawing Sheets

K-SPACE SYNTHESIS FOR MR IMAGING IN THE PRESENCE OF GRADIENT FIELD NONLINEARITY

This application is related to Provisional Application U.S. Serial No. 60/168,121 filed Nov. 30, 1999 in the U.S. Patent and Trademark Office, the contents of which are incorporated herein by reference, and the benefit of priority to which is claimed under 35 U.S.C. 199(e).

BACKGROUND OF THE INVENTION

This invention relates to magnetic resonance imaging (MRI) systems and more particularly to such systems used for reconstructing corrected MR images.

Conventional MR scanners rely on gradient field linearity to achieve linear mapping of a spin's spatial location to its resonance frequency. Given that such a linear relationship between position and frequency is strictly maintained inside the imaged region, the MR signal measurements can be interpreted as samples of the imaged region's spatial spectrum. This powerful interpretation constitutes the foundation of Fourier transform (FT) based MR imaging techniques. Fourier transform based MR imaging techniques rely on establishing a liner gradient magnetic field across the imaged region and modeling MR data as k-space samples. In the presence of gradient field nonlinearity however, this interpretation becomes inaccurate and direct FT reconstruction with the MR data generally results in images with geometrical and intensity distortions. Existing methods correct the distortions based on quantifying positioning errors and intensity alterations in the reconstructed images. While such image-space compensation methods have proven to be effective coping with minor nonlinearities, their accuracy fall short in cases where other design factors, including speed, openness, driver power and etc., mandate significant compromise in gradient field linearity.

What is needed is an effective method for MR imaging that is able to correct for gradient field non-linearities.

SUMMARY OF THE INVENTION

A method for reconstructing a corrected Magnetic Resonance (MR) image from acquired image data having distortions due to gradient field non-linearity comprises correcting the distortions in the image data during acquisition of the image data in k-space and reconstructing the image data into the corrected MR image.

BRIEF DESCRIPTION OF THE DRAWINGS

The features and advantages of the present invention will become apparent from the following detailed description of the invention when read with the accompanying drawings in which.

DETAILED DESCRIPTION OF THE INVENTION

Figure 1:
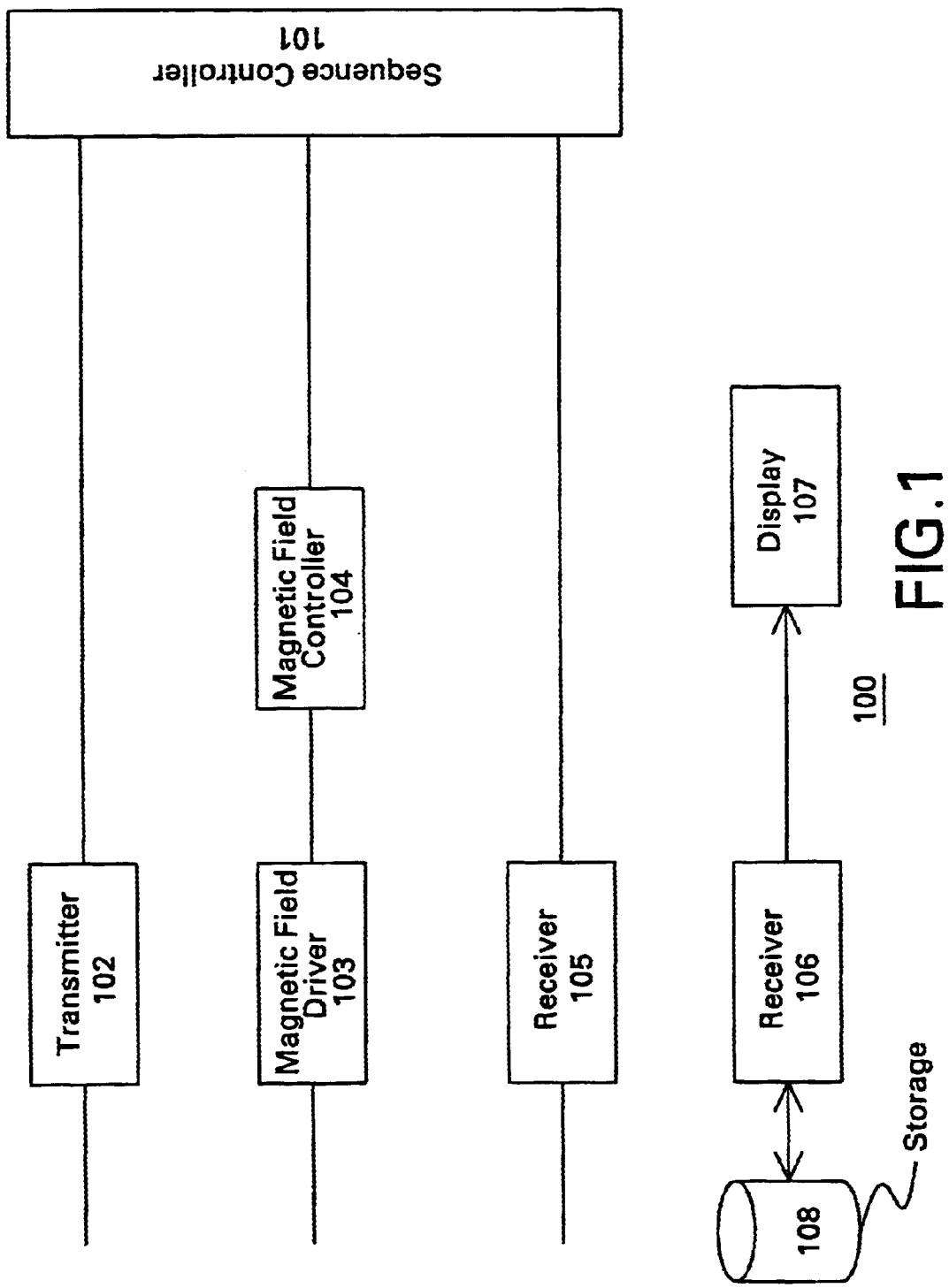
FIG. 1 is a block diagram of a Magnetic Resonance Imaging (MRI) system to which embodiments of the present invention are applicable; and, FIGS. 2–5 are representative illustrations of images in which embodiments of the present invention are employed.

Referring to FIG. 1, there is shown a block diagram of a magnetic resonance imaging (MRI) system for which embodiments of the present invention are applicable. The MRI system 100 comprises a sequence controller 101 for controlling various components of the system, as is well-known, for detecting magnetic resonance signals from the part of an object being imaged; a transmitter 102 for generating an radio frequency (RF) pulse to cause resonance; a magnetic field driver 103 for driving a field gradient in a known manner; a magnetic field controller 104 for controlling the magnetic field; a receiver 105 for receiving and detecting magnetic resonance signals generated from the object; a processor 106 for performing image reconstruction and various calculations for system operation; a display 107 for displaying images; and a peripheral memory device 108 for storing detected signal data and reconstructed image data.

As is well-known, within the processor there is memory for storing measured data and reconstructed images. The memory is sufficient to store the whole of N-dimensional measured data as well as reconstructed data. Two-dimensional data (N×M) is stored in memory. The embodiments of the invention will be discussed hereinafter in two-dimensions (2D), however it is appreciated that one skilled in the art can readily generalize equations and embodiments to higher dimensions.

In a well-known manner, an MR image is constructed from the image or k-space data corresponding to a predetermined plurality of applications of a MRI pulse sequence initiated by a RF pulse such as from transmitter 102 of FIG. 1. The image is updated by collecting image or k-space data from repetitive MRI pulse seqences. An MR image is reconstructed by performing a series of Fourier transforms along a set of orthogonal directions in k-space.

With the assumption that the magnetic fields produced by the x, y and z gradient coils each can be accurately modeled as a product of a spatially dependent component and a temporally dependent component, the total gradient magnetic field can be expressed as:

$$B_{grad}(x, y, z, t) = b_x(x, y, z)f_x(t) + b_y(x, y, z)f_y(t) + b_z(x, y, z)f_z(t) \quad (1)$$

where bx(x,y,z), by(x,y,z) and bz(x,y,z) represent respectively the normalized (unit slope at iso-center) spatial dependence of the x, y and z gradient magnetic fields, and fx(t), fy(t) and fz(t), the time dependence. The direction of the total gradient field is aligned with the direction of the main static field Bo, and that expansions of bx(x,y,z), by(x,y,z) and bz(x,y,z) are dominated by the terms x, y and z respectively.

Based on the well-known Bloch equation, the demodulated signal (ignoring relaxation) during Magnetic Resonance (MR) image acquisition is expressed as in complex terms:

$$G_s(k_x(t), k_y(t), k_z(t)) = \iiint M(x, y, z) e^{-j2\pi(b_x(x,y,z)k_x(t) + b_y(x,y,z)k_y(t) + b_z(x,y,z)k_z(t))} dx\,dy\,dz \quad (2)$$

$$k_x(t) = \frac{\gamma}{2\pi} \int_0^t f_x(\tau) d\tau$$

$$k_y(t) = \frac{\gamma}{2\pi} \int_0^t f_y(\tau) d\tau$$

$$k_z(t) = \frac{\gamma}{2\pi} \int_0^t f_z(\tau) d\tau$$

where $\gamma$ is the gyromagnetic ratio and $M(x,y,z)$ is the distribution of transverse magnetization immediately prior to data acquisition and $(k_x(t), k_y(t), k_z(t))$ represents the programmable traversing trajectory.

In an embodiment, a method for reconstructing a corrected Magnetic Resonance (MR) image from acquired MR data subjected to gradient field non-linearity comprises into Eqn. (2) establishes the relationship between the MR signal measurements and the samples of the transverse magnetization' spectrum:

$$G_s(k_x, k_y, k_z) = \Delta_{k_x}\Delta_{k_y}\Delta_{k_z} \sum_{p=-\infty}^{+\infty}\sum_{q=-\infty}^{+\infty}\sum_{r=-\infty}^{+\infty} G\bigl((p-1/2)\Delta_{k_x}, (q-1/2)\Delta_{k_y}, (r-1/2)\Delta_{k_z}\bigr) \cdot \left[ \int_{\frac{1}{2\Delta k_x}}^{\frac{1}{2\Delta k_x}} \int_{\frac{1}{2\Delta k_y}}^{\frac{1}{2\Delta k_y}} \int_{\frac{1}{2\Delta k_z}}^{\frac{1}{2\Delta k_z}} e^{-j2\pi(b_x(x,y,z)k_x + b_y(x,y,z)k_y + b_z(x,y,z)k_z)} e^{j2\pi(ux+vy+wz)} dxdydz \right]_{\substack{u=(p-1/2)\Delta_{k_x}\\v=(q-1/2)\Delta_{k_y}\\w=(r-1/2)\Delta_{k_z}}} \quad (6)$$

producing a data set that corresponds to linear gradient fields responsive to the acquired MR data and reconstructing the data set into the corrected MR image. Thus, correction for distortion is a k-space based correction method. The present method effectively speeds up reconstruction. Additionally, no extra effort is required to grid data to accommodate non-uniform sampling, such as spiral sampling. Rather than correcting the distortions directly in the image space, the method of the present invention produces or synthesizes an ideal image data set using the acquired MR signal measurements. Reconstruction by Fourier transform of the synthesis result then generates an accurate mapping of the transverse magnetization (correct position, intensity and phase).

The derivations for producing an ideal data set are in the description that follows. The ideal data set as defined herein refers to data corresponding to perfectly linear gradients, i.e., $b_x=x$, $b_y=y$, and $b_z=z$. Let $G(kx, ky, kz)$ denote the Fourier transform of the transverse magnetization $M(x, y, z)$:

$$G(k_x, k_y, k_z) = \int\int\int M(x, y, z)e^{-j2\pi(k_x x + k_y y + k_z z)} dxdydz \quad (3)$$

Assume the non-zero volume of $M(x, y, z)$ is of finite dimension. Then by the sampling theorem, a set of discrete samples of $G(kx, ky, kz)$ fully determines the continuous function $G(kx, ky, kz)$:

$$G(k_x, k_y, k_z) = \quad (4)$$
$$\sum_{p=-\infty}^{+\infty}\sum_{q=-\infty}^{+\infty}\sum_{r=-\infty}^{+\infty} G\bigl((p-1/2)\Delta_{k_x}, (q-1/2)\Delta_{k_y}, (r-1/2)\Delta_{k_z}\bigr) \cdot$$
$$\mathrm{sinc}\bigl(k_x/\Delta_{k_x} - (p-1/2), k_y/\Delta_{k_y} - (q-1/2), k_z/\Delta_{k_z} - (r-1/2)\bigr)$$

$M(x, y, z)$ is related to $G(kx, ky, kz)$ by the inverse Fourier transform:

$$M(x, y, z) = \int\int\int G(k_x, k_y, k_z)e^{j2\pi(k_x x + k_y y + k_z z)} dk_x dk_y dk_z \quad (5)$$

Further derivation includes substituting Eqn. (4) into Eqn. (5), evaluating the integral leads and then applying the result Equation (6) reveals that, in general, the signal measurements $G_s(k_x,k_y,k_z)$ are essentially an interpolation of the evenly spaced samples of the actual spectrum using a kernel whose shape depends on frequency (location in the k-space). This result naturally lends itself to an effective image reconstruction algorithm described below. With linear gradients (i.e., $b_x=x$, $b_y=y$, and $b_z=z$), the kernel is a sinc function and Equation (6) reduces to a form that readily identifies $G_s(k_x, k_y, k_z)$ as $G(k_x, k_y, k_z)$. When nonlinearities are present, this embodiment comprises a reconstruction based on producing an ideal data set by synthesizing $G((p-1/2)\Delta k_x,(q-1/2)\Delta k_y,(r-1/2)\Delta k_z)$ from MR signal measurements, where p, q and r are values in ranges matching desired x-, y- and z-direction resolutions. The synthesized or ideal data set is then used as the basis for the reconstruction by Fourier transform, in order to correct any distortions due to gradient field non-linearity.

Further, reconstruction employs an appropriate trajectory selected in a known-manner. The trajectory leads to a set of linear equations organized in matrix form: $Ag=g_s$. A is the matrix that contains the coefficients of the equations, g is the vector that contains the synthesized data sets, and $g_s$ is the vector that collects the MR data or signal measurements. A least square solution is then be Fourier transformed to reconstruct $M(x,z,y)$.

Figure 2:
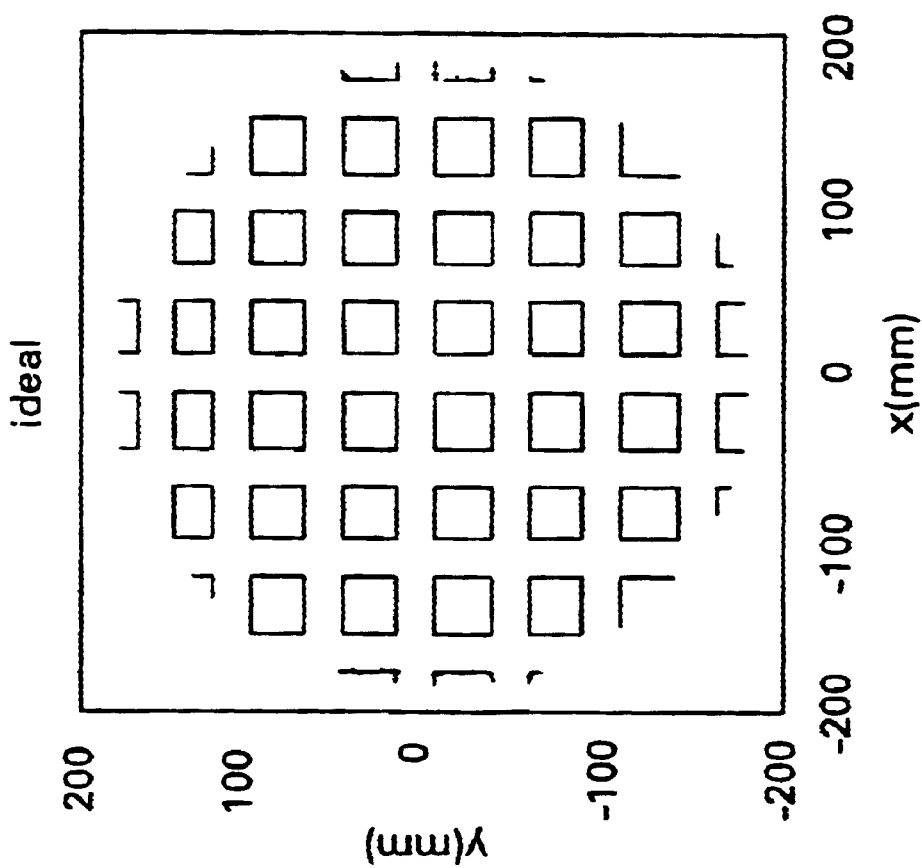
Figure 3:
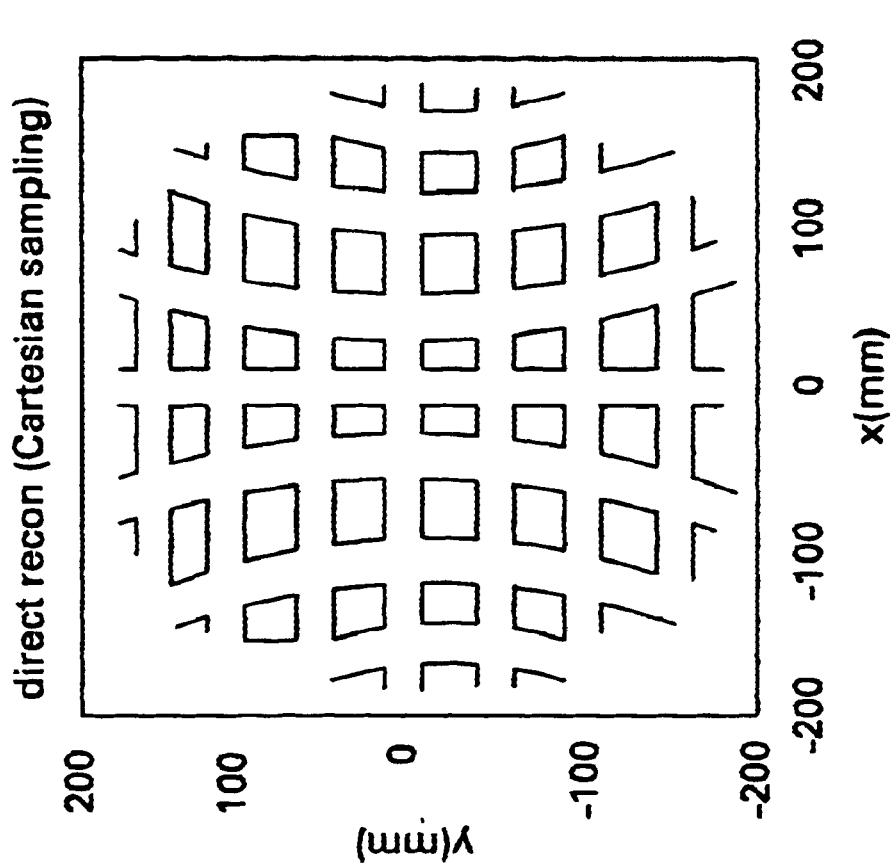
Figure 4:
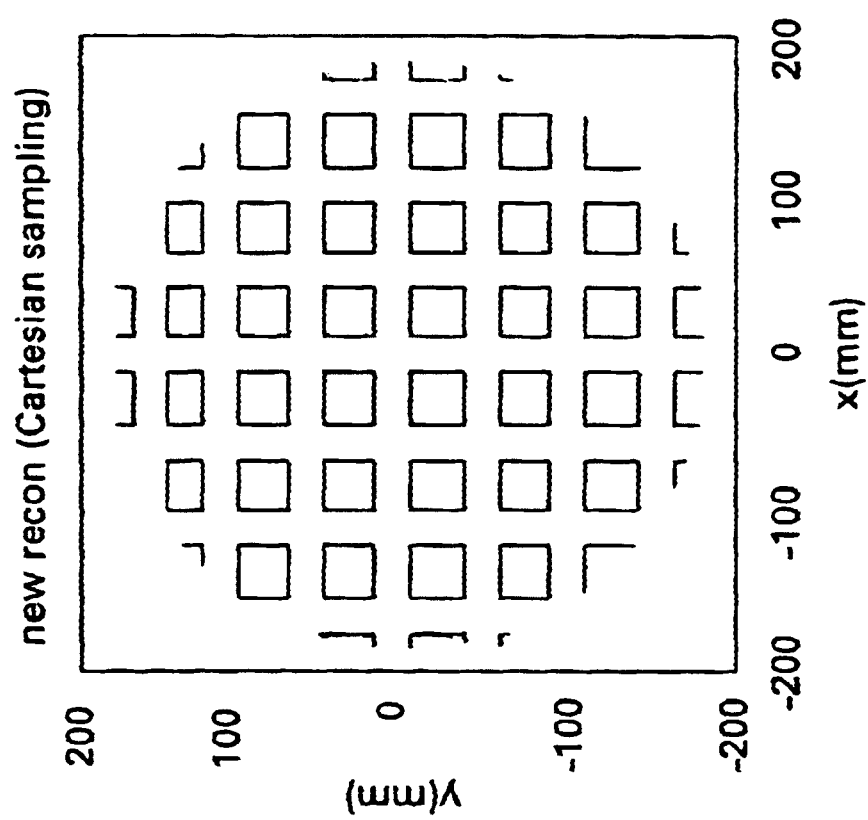
Figure 5:
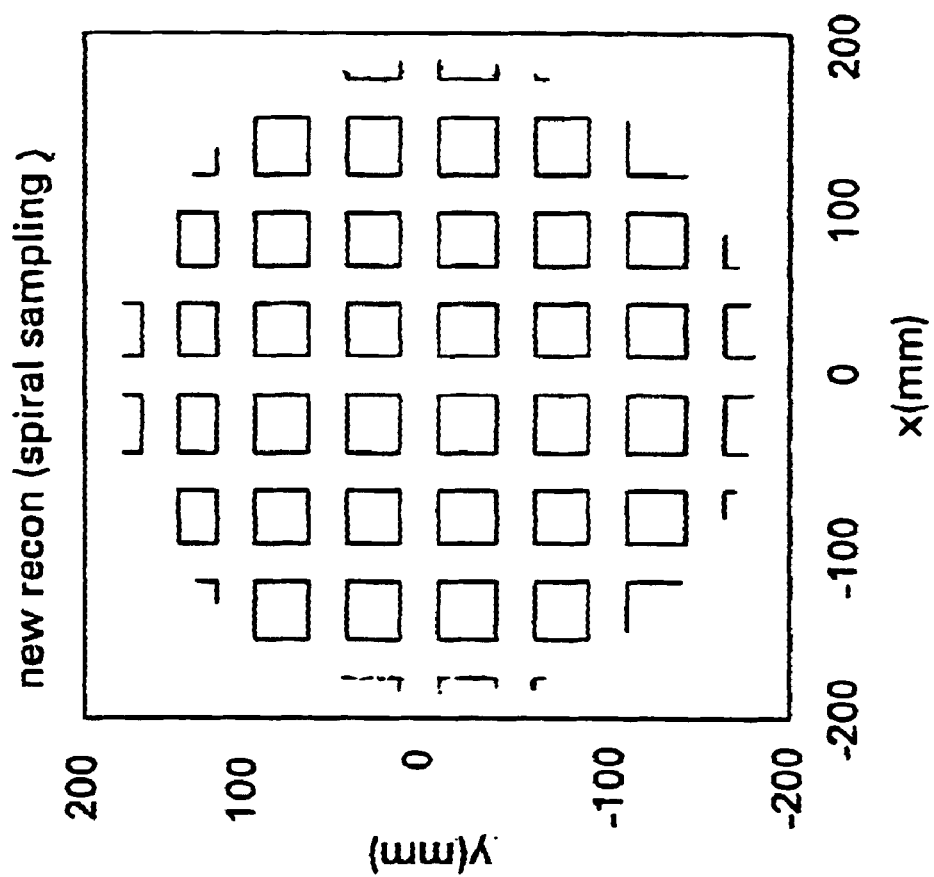

FIGS. 2–5 illustrate a two-dimensional (2D) computer simulation study where the x- and y-gradient fields had significant non-linearities—$b^x(x,y)$ ($b_y(x,y)=b_x(y,x)$) and assumed a $7^{th}$ order spherical harmonic expansion, causing the x-direction slope to vary from 1 at the isocenter to approximately 1.5 near the edge of the 400 mm×400 mm field of view. With the gradients, two sets of MR data acquired using evenly spaced Cartesian trajectory and Archimedean spiral trajectory were simulated respectfully. In each case, $\{G((p-1/2), (q-1/2)\}$, $-63 \leq p \leq 64$, $-63 \leq q \leq 64$ were computed from the data for use in reconstruction. Referring to FIGS. 2–5, illustrations of the practical effect of the present invention are shown. FIG. 2 shows a simulation of an ideal result, based on perfectly linear gradients. It is to be appreciated that this is a simulated result, ideal data is highly unlikely in practice and is shown for illustration purposes only. FIG. 3 shows the result using conventional image-based direct FT reconstruction methods with data measured under the non-linear field using Cartesian sampling. Applying the present reconstruction method to the same data set (with Cartesian sampling) is shown in FIG. 4. FIG. 5 results from applying the present reconstruction method to data measured under the nonlinear gradient field using spiral sampling. Comparison of the reconstructed images with an ideal result demonstrates that position, intensity and phase are accurately presented, while the convention image-based direct FT reconstruction shows distortion.

It is to be appreciated that the present method may be used for Cartesian or spiral sampling. There is no requirement to grid the data in order to accommodate non-uniform (e.g. spiral sampling) since correction is performed in k-space. Further, the synthesis or approximation further speeds up reconstruction while maintaining image quality. Additionally, corrections are effectively performed simultaneously with data acquisition.

When gradients assume more general spatial variation patterns, the present invention overcomes the limitations of existing image-space correction. For a given field of view, the spatial resolutions and traversing trajectory are pre-computed. After each data acquisition, image reconstruction comprises computing the A matrix and performing a Fourier transform. In addition, distortions due to $B_0$ field inhomogeneity may be simultaneously corrected if Equations (3) and (6) take into account $\Delta B_0(x,y,z)$ While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A method for reconstructing a corrected Magnetic Resonance (MR) image for MR data subjected to gradient field non-linearity, said method comprising:

producing a data set from MR signal measurements, said data corresponding to linear gradient fields responsive to said MR data; and, reconstructing said corrected MR image using said data set to correct for distortions due to gradient field non-linearity.

2. The method of claim 1 wherein said producing step comprises synthesizing an ideal data set from said MR data.

3. A method for reconstructing a corrected image in a Magnetic Resonance Imaging (MRI) system in the presence of gradient field non-linearity, said method comprising pre-computing a traversing trajectory responsive to acquired MR data;

traversing said acquired MR data in k-space in accordance with said pre-computed trajectory;

producing a data set from said MR data, said data set corresponding to linear gradient fields responsive to said acquired MR data; and, reconstructing said corrected MR image using said data set to correct for distortions due to gradient field non-linearity.

4. The method of claim 3 wherein said producing step comprises synthesizing an ideal data set from said acquired MR data.

5. The method of claim 3 wherein said traversing step is performed with Cartesian sampling.

6. The method of claim 3 wherein said traversing step is performed with spiral sampling.

* * * * *